(12) United States Patent
Briano et al.

(10) Patent No.: US 11,342,288 B2
(45) Date of Patent: May 24, 2022

(54) SIGNAL ISOLATOR HAVING AT LEAST ONE ISOLATION ISLAND

(71) Applicant: Allegro MicroSystems, LLC, Manchester, NH (US)

(72) Inventors: Robert A. Briano, Auburn, NH (US); Alejandro Gabriel Milesi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 302 days.

(21) Appl. No.: 16/430,849

(22) Filed: Jun. 4, 2019

(65) Prior Publication Data

US 2020/0388581 A1      Dec. 10, 2020

(51) Int. Cl.
| | |
|---|---|
| *H01L 23/64* | (2006.01) |
| *H01L 23/66* | (2006.01) |
| *H01L 23/552* | (2006.01) |
| *H03H 7/00* | (2006.01) |
| *H04L 25/02* | (2006.01) |

(52) U.S. Cl.
CPC .......... *H01L 23/642* (2013.01); *H01L 23/552* (2013.01); *H01L 23/66* (2013.01); *H03H 7/004* (2013.01); *H04L 25/0266* (2013.01)

(58) Field of Classification Search
CPC ..... H01L 23/642; H01L 23/552; H01L 23/66; H03H 7/004; H04L 25/0266
USPC ........................................................ 257/503
See application file for complete search history.

(56) References Cited

U.S. PATENT DOCUMENTS

| | | | |
|---|---|---|---|
| 5,812,363 | A | 9/1998 | Kuroda et al. |
| 6,873,065 | B2 | 3/2005 | Haigh et al. |
| 8,169,108 | B2 | 5/2012 | Dupuis et al. |
| 8,643,138 | B2 | 2/2014 | Dong |
| 9,514,879 | B2 | 12/2016 | Pagani |
| 9,660,848 | B2 | 5/2017 | Yun et al. |
| 10,074,939 | B1 | 9/2018 | Briano |
| 2006/0263727 | A1 | 11/2006 | Lee et al. |
| 2008/0158777 | A1 | 7/2008 | Sohn et al. |

(Continued)

FOREIGN PATENT DOCUMENTS

| | | |
|---|---|---|
| DE | 10 2013 100 622 A1 | 7/2014 |
| WO | WO 2013/155565 A1 | 10/2013 |

OTHER PUBLICATIONS

Partial European Search Report dated Sep. 8, 2020 for European Application No. 20174344.0; 18 Pages.

(Continued)

*Primary Examiner* — Tong-Ho Kim
(74) *Attorney, Agent, or Firm* — Daly Crowley Mofford & Durkee, LLP

(57) ABSTRACT

Methods and apparatus for a signal isolator having reduced parasitics. An example embodiment, a signal isolator and include a first metal region electrically connected to a first die portion, a second die portion isolated from the first die portion, and a second metal region electrically connected to the second die portion. A third metal region can be electrically isolated from the first and second metal regions and a third die portion can be electrically isolated from the first, second and third metal regions. In embodiments, the first metal region, the second metal region, and the third metal region provide a first isolated signal path from the first die portion to the second die portion.

20 Claims, 12 Drawing Sheets

(56) References Cited

U.S. PATENT DOCUMENTS

| | | | |
|---|---|---|---|
| 2008/0218258 A1 | 9/2008 | Crawley et al. | |
| 2011/0148549 A1 | 6/2011 | Kanschat et al. | |
| 2012/0181874 A1 | 7/2012 | Willkofer et al. | |
| 2013/0278077 A1 | 10/2013 | Mueck | |
| 2013/0278372 A1 | 10/2013 | Stecher et al. | |
| 2013/0335882 A1 | 12/2013 | Ma et al. | |
| 2014/0183698 A1 | 7/2014 | Hsu et al. | |
| 2014/0253225 A1* | 9/2014 | Lee | H01L 23/5227 327/535 |
| 2015/0200162 A1* | 7/2015 | Constantino | H01L 23/49537 257/532 |
| 2016/0126367 A1 | 5/2016 | Dunton et al. | |
| 2016/0163692 A1 | 6/2016 | Moghe et al. | |

OTHER PUBLICATIONS

Daughton, "Spin-Dependent Sensors;" Invited Paper; Proceedings of the IEEE, vol. 91, No. 5; May 2003; 6 Pages.
Knoedl, Jr. et al., "A Monolithic Signal Isolator;" Proceedings of the 4th Annual IEEE Applied Power Electronics Conference and Exposition; Mar. 13, 1989; pp. 165-170; 6 Pages.
U.S. Notice of Allowance dated Jun. 13, 2018 for U.S. Appl. No. 15/671,357; 12 Pages.
Extended European Search Report dated Jan. 4, 2019 for European Application No. 18185696.4; 5 Pages.
Response (with Amended Specification & Claims) to Extended European Search Report dated Jan. 4, 2019 for European Application No. 18185696.4; Response filed Jun. 4, 2019; 14 Pages.
European Intention to Grant dated Apr. 20, 2020 for European Application No. 18185696.4; 6 Pages.
Response to Search Opinion dated Dec. 14, 2020 for European Application No. 20174344.0; Response filed on Jun. 15, 2021; 5 Pages.
Akiyama et al., "A High-Voltage Monolithic Isolator for a Communication Network Interface;" IEEE Transactions on Electron Devices, vol. 49, No. 5; May 2002; 7 Pages.
Extended European Search Report dated Oct. 12, 2020 for European Application No. 20174344.0; 21 Pages.
U.S. Appl. No. 15/906,291, filed Feb. 27, 2018, Briano et al..
U.S. Appl. No. 16/539,405, filed Aug. 13, 2019, Briano.
U.S. Appl. No. 16/547,823, filed Aug. 22, 2019, Briano et al.
Culurciello et al., "Monolithic Digital Galvanic Isolation Buffer Fabricated in Silicon on Sapphire CMOS;" Electronic Letters, vol. 41, No. 9; Apr. 28, 2005; 2 Pages.
Moghe et al., "Monolithic 2.5kV RMS, 1,8V-3.3V Dual Channel 640Mbps Digital Isolator in 0.5μm SOS;" Proceedings of the IEEE International SOI Conference; Oct. 1, 2012; 2 Pages.
European Examination Report dated Sep. 26, 2019 for European Application No. 18185696.4; 4 Pages.
Response (with Amended Claims) to European Examination Report dated Sep. 26, 2019 for European Application No. 18185696.4; Response filed Jan. 13, 2020; 7 Pages.
Restriction Requirement dated Feb. 24, 2022 for U.S. Appl. No. 17/067,178, 6 pages.

* cited by examiner

SIGNAL ISOLATOR HAVING AT LEAST ONE ISOLATION ISLAND

BACKGROUND

As is known in the art, signal isolators can be used to transfer information across a barrier used to separate two or more voltage domains for safety or functional isolation. For example, capacitive coupling can be used to transfer information across a barrier. Optocouplers include a LED that emits light through an optically transparent insulating film and strikes a photo detector that generates a current flow that corresponds to the emitted light. RF carriers can also be used to transmit information across an isolation barrier.

SUMMARY

The present invention provides methods and apparatus for a signal isolator having reduced parasitics for increasing data signal characteristics. Embodiments can provide capacitively-coupled isolated signal paths and/or inductively-coupled isolated signal paths. Some embodiments can include differential signal paths from a first voltage domain to a second voltage domain of the isolator. In embodiments, a die can include one or more isolated portions to provide multiple data paths from a first die portion to a second die portion.

In one aspect, a signal isolator comprises a first die portion; first metal region electrically connected to the first die portion; a second die portion isolated from the first die portion; a second metal region electrically connected to the second die portion; a third metal region electrically isolated from the first and second metal regions; a third die portion electrically isolated from the first, second and third metal regions, wherein the first metal region, the second metal region, and the third metal region provide a first isolated signal path from the first die portion to the second die portion; and wherein the first metal region, the second metal region and the third die portion provide a second isolated signal path from the first die portion to the second die portion in parallel with the first isolated signal path.

A signal isolator can include one or more of the following features: the first die portion, the second die portion and the third die portion are formed in a first layer, wherein the third die portion is electrically isolated from the first and second die portions, the first layer comprises an epitaxial layer, the third die portion is separated from the first die portion and the second die portion by respective isolating trenches, a layer of conductive material deposited on a top of the third die portion, the first and second metal regions are formed in a first metal layer, a third metal region is formed in a second metal layer, the first isolated signal path comprises a first capacitor capacitively coupled with a second capacitor, wherein the first capacitor comprises the first metal region and the third metal region, and the second capacitor comprises the third metal region and the second metal region, the second isolated signal path includes a third capacitor capacitively coupled to a fourth capacitor, wherein the third capacitor comprises the first metal region and the third die portion, and the fourth capacitor comprises the third die portion and the second metal region, the third metal region overlaps with the first and second metal regions, and/or the first isolated signal path comprises a differential signal pair.

In another aspect, a signal isolator comprises: a first die portion; first metal region electrically connected to the first die portion; a second die portion isolated from the first die portion; second metal region electrically connected to the second die portion; third metal region electrically isolated from the first and second metal regions; third die portion electrically isolated from the first, second and third metal regions; and a fourth die portion electrically isolated from the first, second and third metal regions and isolated from the third die portion, wherein the first metal region, the second metal region, and the third metal region provide an isolated signal path from the first die portion to the second die portion.

An isolator can further include one or more of the following features: the first die portion, the second die portion, the third die portion, and the fourth die portion are formed in a first layer, wherein the third die portion is electrically isolated from the fourth die portion, the first layer comprises an epitaxial layer, the third die portion is separated from the fourth die portion by respective isolating trenches, the first and second metal regions are formed in a first metal layer, a third metal region is formed in a second metal layer, the isolated signal path comprises a first capacitor capacitively coupled with a second capacitor, wherein the first capacitor comprises the first metal region and the third metal region, and the second capacitor comprises the third metal region and the second metal region, the third metal region overlaps with the first and second metal regions, and/or the isolated signal path comprises a differential signal pair.

In a further aspect, a method for providing a signal isolator comprises: employing a first die portion electrically connected to a first metal region; employing a second die portion which is isolated from the first die portion; employing a second metal region electrically connected to the second die portion; employing a third metal region electrically isolated from the first and second metal regions; employing a third die portion electrically isolated from the first, second and third metal regions, wherein the first metal region, the second metal region, and the third metal region provide a first isolated signal path from the first die portion to the second die portion; and wherein the first metal region, the second metal region and the third die portion provide a second isolated signal path from the first die portion to the second die portion in parallel with the first isolated signal path.

A method can further include one or more of the following features: the first die portion, the second die portion and the third die portion are formed in a first layer, wherein the third die portion is electrically isolated from the first and second die portions, the first layer comprises an epitaxial layer, the third die portion is separated from the first die portion and the second die portion by respective isolating trenches, employing a layer of poly-silicon deposited on a top of the third die portion, the first and second metal regions are formed in a first metal layer, a third metal region is formed in a second metal layer, the first isolated signal path comprises a first capacitor capacitively coupled with a second capacitor, wherein the first capacitor comprises the first metal region and the third metal region, and the second capacitor comprises the third metal region and the second metal region, the second isolated signal path includes a third capacitor capacitively coupled to a fourth capacitor, wherein the third capacitor comprises the first metal region and the third die portion, and the fourth capacitor comprises the third die portion and the second metal region, and/or the third metal region overlaps with the first and second metal regions.

In a further aspect, a method comprises: employing a first die portion; employing a first metal region electrically connected to the first die portion; employing a second die portion isolated from the first die portion; employing a second metal region electrically connected to the second die portion; employing a third metal region electrically isolated from the first and second metal regions; employing a third die portion electrically isolated from the first, second and third metal regions; and employing a fourth die portion electrically isolated from the first, second and third metal regions and isolated from the third die portion, wherein the first metal region, the second metal region, and the third metal region provide an isolated signal path from the first die portion to the second die portion.

In a further aspect a signal isolator comprises: a first die portion; first metal region electrically connected to the first die portion; a second die portion isolated from the first die portion; a second metal region electrically connected to the second die portion; a third die portion electrically isolated from the first and second metal regions, wherein the first metal region and the second metal region provide a first isolated signal path from the first die portion to the second die portion; and wherein the first metal region, the third die portion, and the second metal region and provide a second isolated signal path from the first die portion to the second die portion.

A signal isolator can further include one or more of the following features: the first metal region comprises a first coil and the second metal region comprises a second coil, wherein the first and second coils are inductively coupled, the first isolated signal path comprises a differential signal pair.

In a further aspect, a signal isolator, comprises: a first die portion; first metal region electrically connected to the first die portion; a second die portion isolated from the first die portion; a second metal region electrically connected to the second die portion; a third die portion electrically isolated from the first and second metal regions; and a fourth die portion electrically isolated from the first and second metal regions and isolated from the third die portion, wherein the first metal region and the second metal region provide an isolated signal path from the first die portion to the second die portion. The first metal region may comprise a first coil and the second metal region may comprise a second coil, wherein the first and second coils are inductively coupled.

BRIEF DESCRIPTION OF THE DRAWINGS

The foregoing features of this invention, as well as the invention itself, may be more fully understood from the following description of the drawings in which.

DETAILED DESCRIPTION

Figure 1:
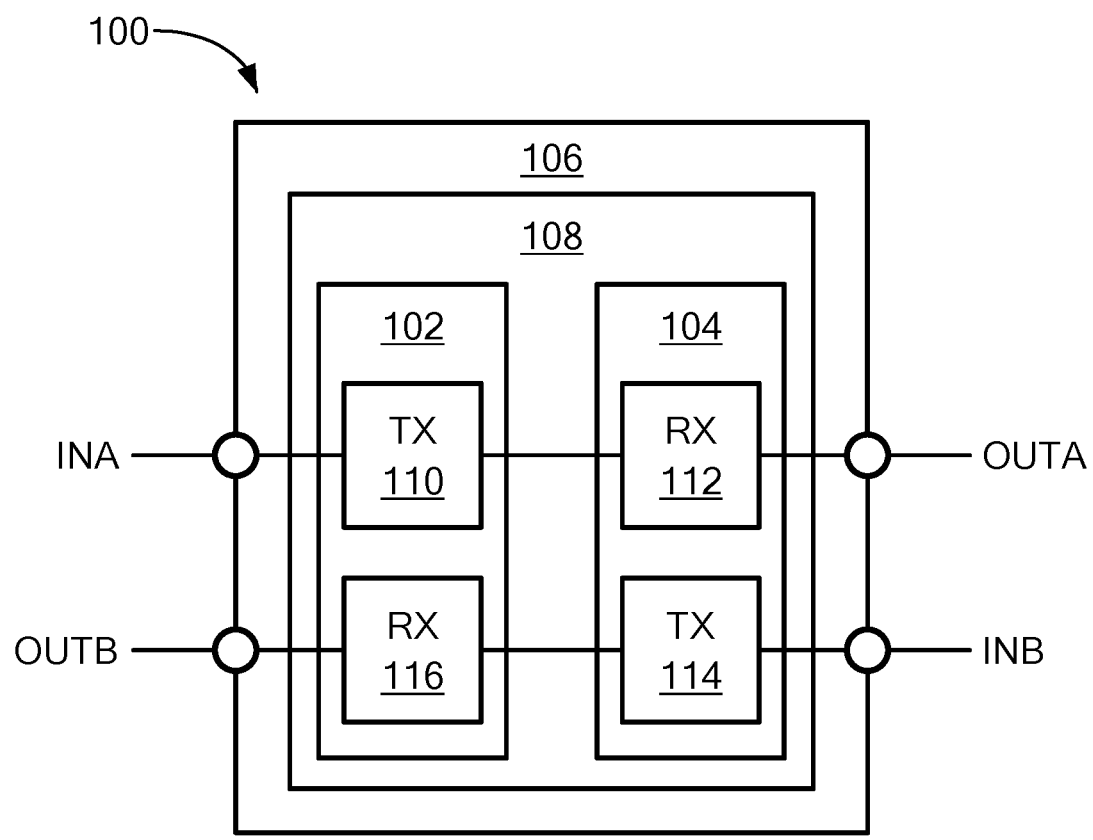
FIG. 1 is a schematic representation of a signal isolator having reduced parasitics in accordance with example embodiments of the invention.

FIG. 1 shows an example of a signal isolator 100 including first and second die portions 102, 104 that form part of an integrated circuit package 106 having capacitive and/or inductive signal coupling with at least one isolation island between the first and second die portions in accordance with example embodiments of the invention. In embodiments, the first and second die portions 102, 104 are part of a single die and are isolated from each other. In an embodiment, the IC package 106 includes a first input signal INA connected to the first die portion 102 and a first output signal OUTA connected to the second die portion 104. The IC package 106 further includes a second input signal INB connected to the second die portion 104 and a second output signal OUTB to the first die portion 104. The first and second die portions 102, 104 are separated by a barrier region 108, such as an isolation barrier.

In embodiments, the first die portion 102 includes a first transmit module 110 and the second die portion 104 includes a first receive module 112 that provides a signal path from the first input signal INA to the first output signal OUTA across the barrier 108. The second die portion 104 includes a second transmit module 114 and the first die portion 104 includes a second receive module 116 that provides a signal path from the second input signal INB to the second output signal OUTB across the barrier 108.

It is understood that any practical number of transmit, receive, and transmit/receive modules can be formed on the first and/or second die portions to meet the needs of a particular application. It is further understood that transmit, receive, and transmit/receive modules can comprise the same or different components. In addition, in embodiments, bi-directional communication is provided across the barrier. Further, circuitry in the first and/or second die portions can be provided to process signals, perform routing of signals, and the like. In some embodiments, sensing elements are formed in, on, or about the first and/or second die.

Figure 2A:
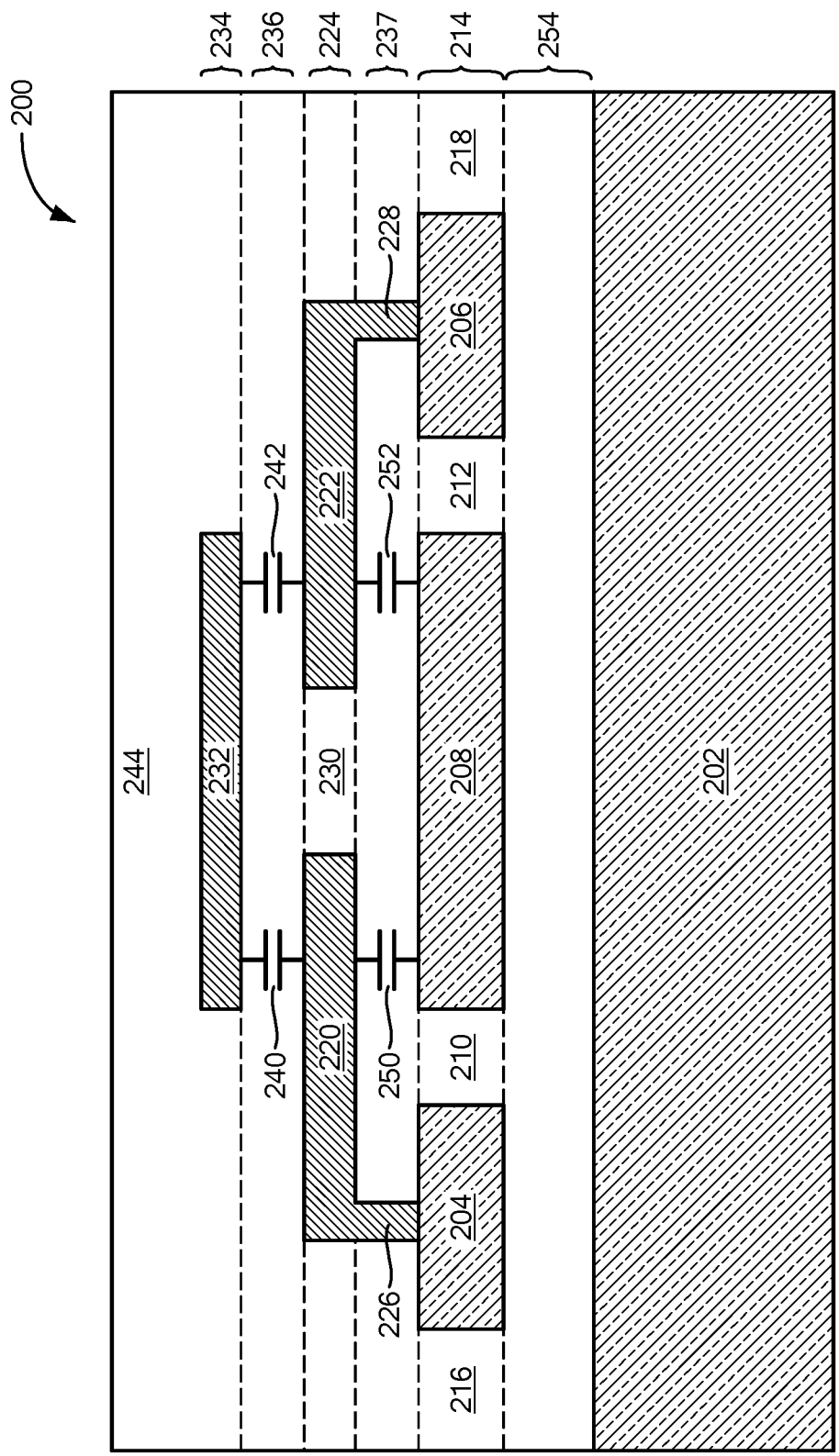
FIG. 2A is a cross-sectional representation of a signal isolator including capacitive signal coupling and having first and second voltage domains each in its own isolation island in accordance with example embodiments of the invention.
Figure 2B:
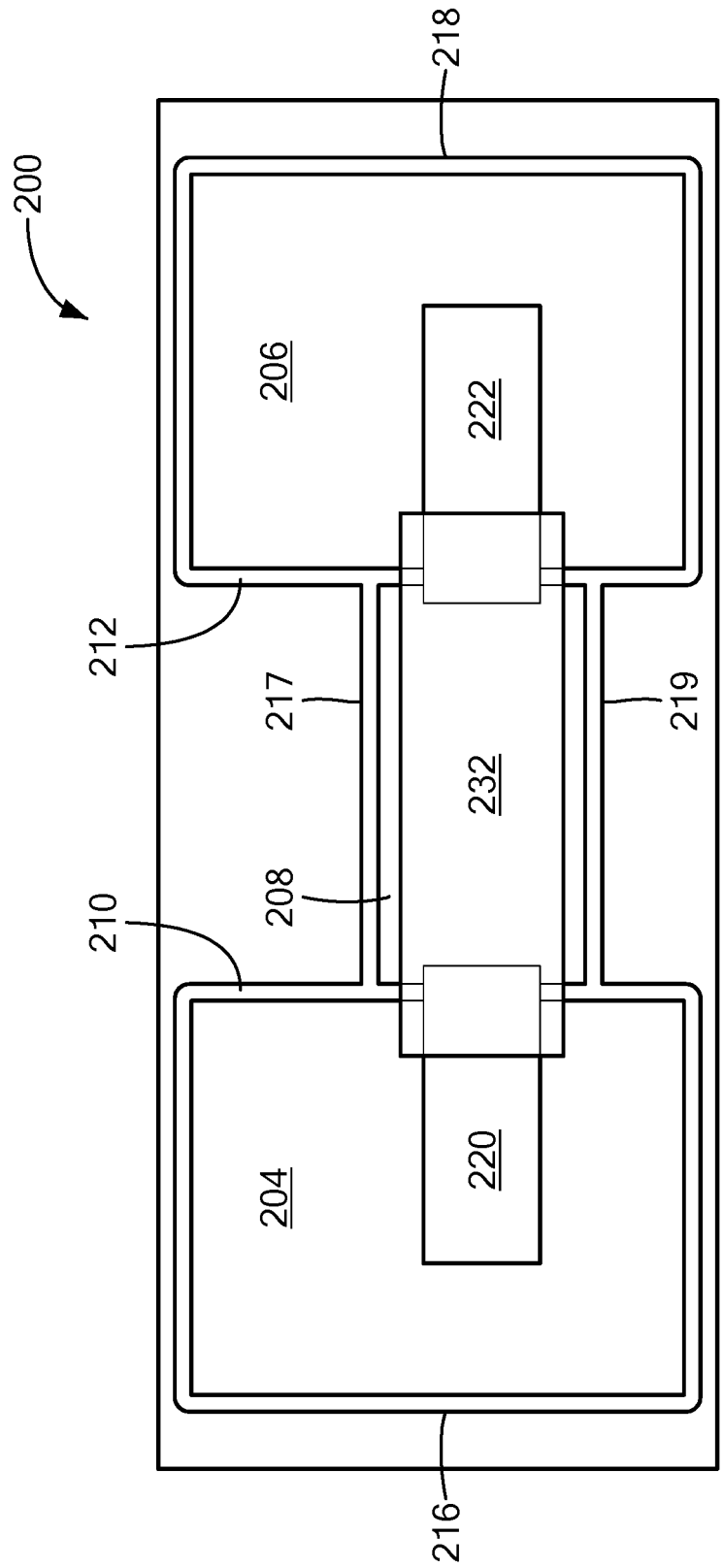
FIG. 2B is a representation of the signal isolator of FIG. 2A from the top.

FIGS. 2A and 2B show an example single die signal isolator 200 having a bulk silicon substrate 202, such as SOI, with a first die portion 204 and a second die portion 206 separated by an isolation island 208. In example embodiments, the first and second die portions 204, 206 comprise epitaxial regions and the isolation region 208 comprises an isolated epitaxial island region, which is separated from the first and second die portions 204, 206 by respective isolating trenches 210, 212 formed in the epitaxial layer 214. In embodiments, the first and second die portions 204, 206 and the isolation region 208 can be formed from a single die. Further trenches 216, 218 can be located on the outer ends of the first and second die portions 204,206. As seen in FIG. 2B, further trenches 217, 219 can be formed in the 'front' and 'back' of the epitaxial island 208. Trenches can comprise any suitable material, such as SiO2. In embodiments, circuitry to provide signal isolator functionality, such as transmitting and receiving signals, can be provided in the first and second die portions 204, 206.

A first metal region 220 and a second metal region 222 can be formed within a first metal layer 224. A first via 226 couples the first metal region 220 to the first die portion 204 and a second via 228 couples the second metal region 222 to the second die portion 206. Within the first metal layer 224, dielectric material 230 can isolate the first and second metal regions 220, 222. A third metal region 232 can be formed in a second metal layer 234. In embodiments, the third metal region 232 is separated from the first and second metal regions 220, 222 by an inter-metal dielectric layer (IMD) 236, such as SiO2. The first metal layer 224 can be separated from the epitaxial layer 214 by a further IMD layer 237. It is understood that first and second metal regions 220, 222 do not need to be in the same layer. The third metal region 232 can be above or below the first and second metal regions 220, 222.

A first circuit component 240, such as a capacitor, is formed by the first metal region 220 and the third metal region 232 and a second circuit component 242, such as a capacitor, is formed by the second metal region 222 and the third metal region 232. It is understood that the capacitor symbols 240, 242 represent the capacitance provided by the respective first and second metal regions 220, 222 and the third metal region 232. As best seen in FIG. 2B, the third metal region 232 overlaps a portion of the first metal region 220 and a portion of the second metal region 222 to form the respective capacitors 240, 242. A passivation layer 244 can be provided over the third metal region 232 and dielectric layer 236, e.g., SiO2. The epitaxial layer 214 can be isolated from the substrate 202 by a buried oxide layer 254, for example.

In embodiments, the first and second capacitors 240, 242 are connected in a series interconnection to provide a first isolated signal path from the first die portion 204 to the second die portion 206. As described in FIG. 1, a signal on INA on the first die portion 102 can be transmitted across isolation barrier 108 and output on OUTA. For example, an input signal is transferred through the conductive first via 226 from circuitry on the first die portion 204 to the first metal region 220, which can be referred to as a mid-level metal in example embodiments. The first metal region 220 and the third metal region 232, which can be referred to as a higher metal layer, are capacitively coupled to effect signal transfer to the second die portion 206 via the second capacitor 242 formed by the third metal region 232 and the second metal region 222. In embodiments, an SiO2 IMD (inter-metal dielectric) layer 236 separates the metal layers 224, 234. With this arrangement, the first and second die regions 204, 206, e.g., EPI regions, are capacitively coupled to enable signal transfer via an isolated signal path.

In embodiments, a third capacitance 250 is generated between the first metal region 220 and the isolation island 208. A fourth capacitance 252 is provided between the second metal region 222 and the isolation island 208. A second isolated signal path from the first die region 204 to the second die region 206 is provided by the third and fourth capacitances. The second isolated signal path includes a path from the first metal region 220, which is electrically connected to the first die region 204, to the isolation island 208, from the isolation island 208 to the second metal region 222, which is electrically connected to the second die region. Thus, the third and fourth capacitances 250, 252 with the isolation island 208 provide the second isolated signal path between the first and second die regions 204, 206. It will be appreciated that the first and second isolated signal paths are electrically in parallel so as to improve signal characteristics as data passes between the first and second die regions 204, 206.

Figure 2C:
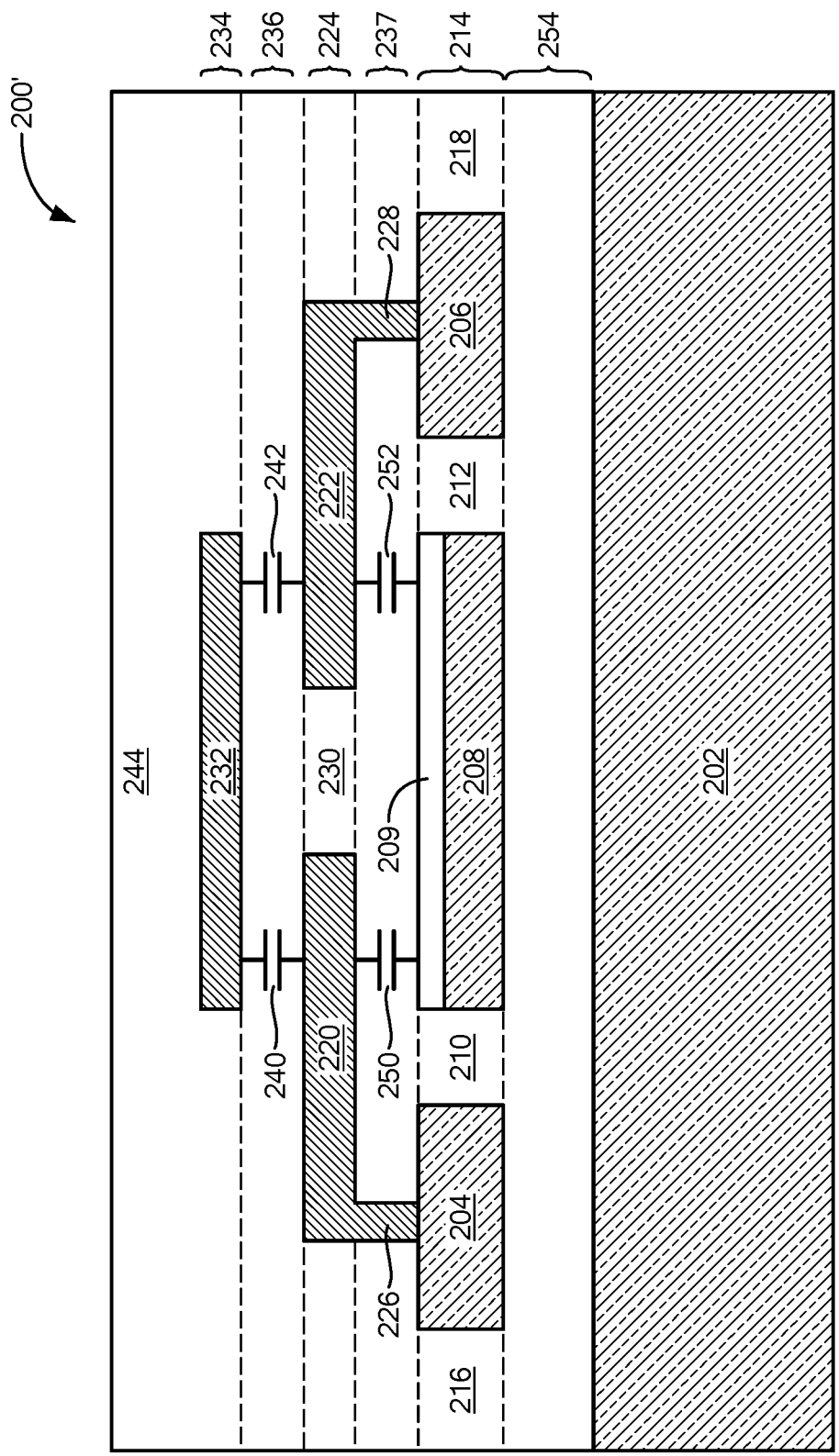
FIG. 2C is a cross-sectional representation of a signal isolator having first and second voltage domains each in its own isolation island with a conductive layer in accordance with example embodiments of the invention.

FIG. 2C shows an example signal isolator 200' having similarity with the isolator 200 of FIG. 2A with the addition of a conductive material 209, such as polysilicon or metal, formed on the island 208. The conductive material 209 alters the impedance of the parasitic capacitances 250, 252. In the illustrated embodiment of FIG. 2C, the parasitic capacitance is in parallel with the signal capacitors and the parasitic capacitance carries a portion of that signal to the second metal region 222. In embodiments, the polysilicon 209 is more conductive than the isolation island 208, which enhances the signal path characteristics from the first die portion 204 to the second die portion via the isolation island 208.

Figure 2D:
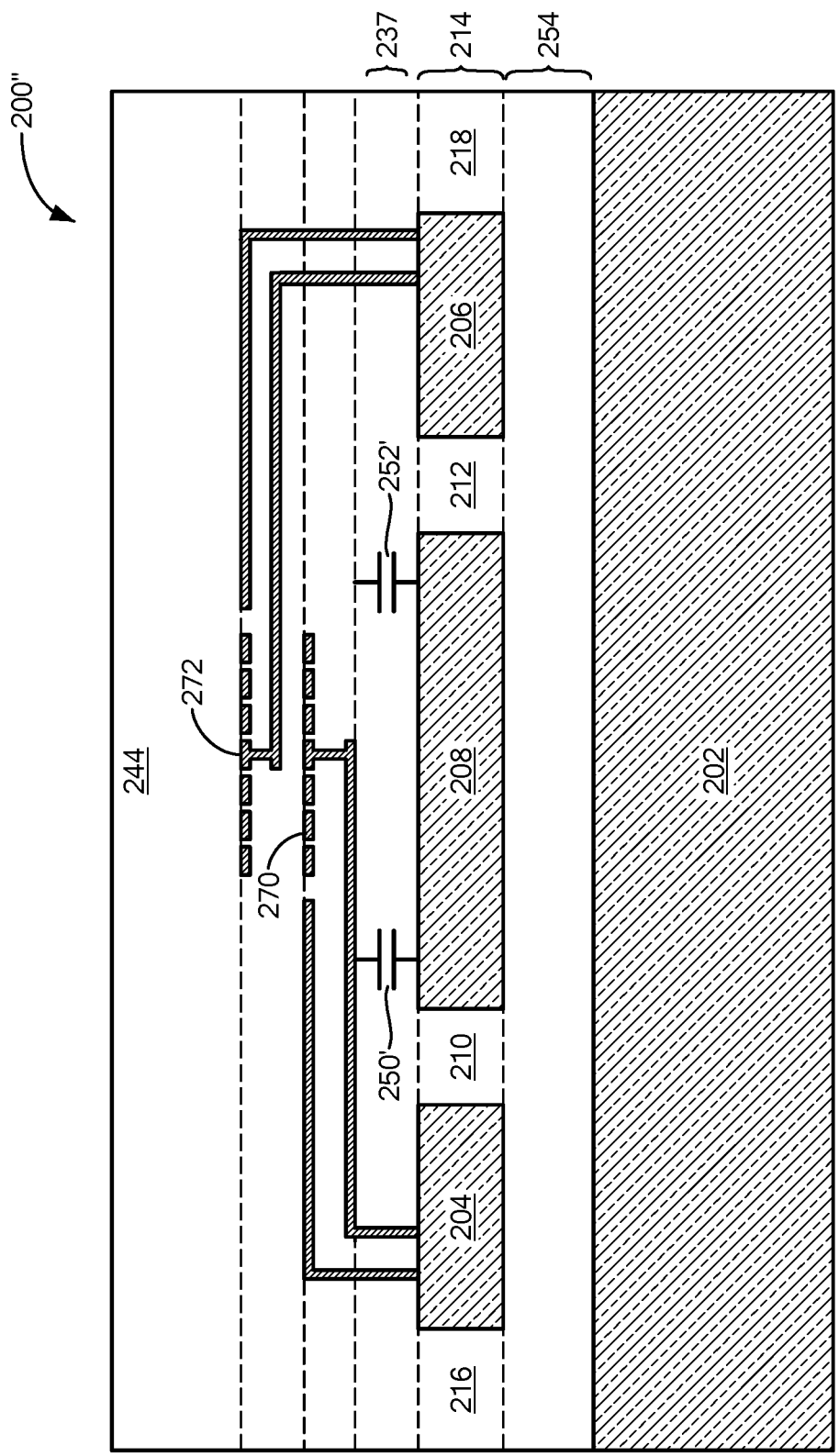
FIG. 2D is a cross-sectional representation of a signal isolator including inductive signal coupling and having an isolation island in accordance with example embodiments of the invention.

FIG. 2D shows an example signal isolator 200" having similarity with the isolator 200 of FIG. 2A. In the signal isolator 200" of FIG. 2D, the first and second die regions 204, 206 are connected via an inductively coupled signal path. A first coil 270 is coupled to the first die region 204 and a second coil 272 is coupled to the second die region 206. At least a portion of the first and second coils 270, 272 overlap with each other so that they are inductively coupled. A first parasitic capacitance 250' may be generated between the first coil 270 and the island 208 and a second parasitic capacitance 252' may be formed between the second coil 272 and the island 208. The coils 270, 272 may be separated by IMD layers for electrical isolation. With this arrangement, a signal from the first die region 204 is transmitted to the second die region via the coils 270, 272, and vice-versa. As described above, the isolation island 208 modifies the signal through the parasitic capacitances 250', 252' by providing a second isolated signal path from the first die region 204 to the second die region 206.

Figure 2E:
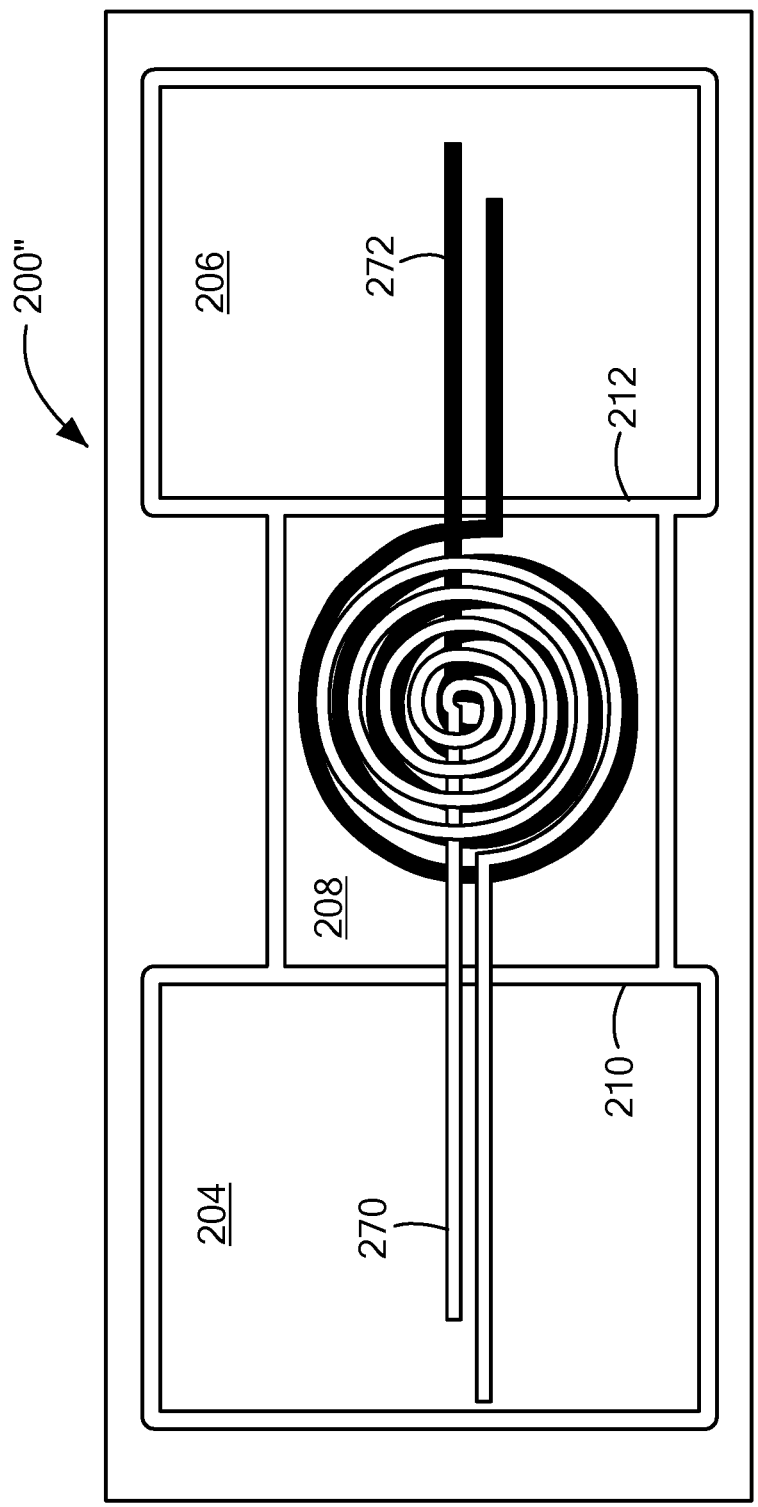
FIG. 2E is a representation of the signal isolator of FIG. 2D from the top.

FIG. 2E shows the signal isolator 200" of FIG. 2D with example first and second coils 270, 272 that are round and overlapping. It is understood that the coils can have any practical geometry to meet the needs of a particular application. Without limitation thereto, example coil shapes include rectangular, polygonal, trapezoidal, circular, ovular, arcuate, etc.

Figure 2F:
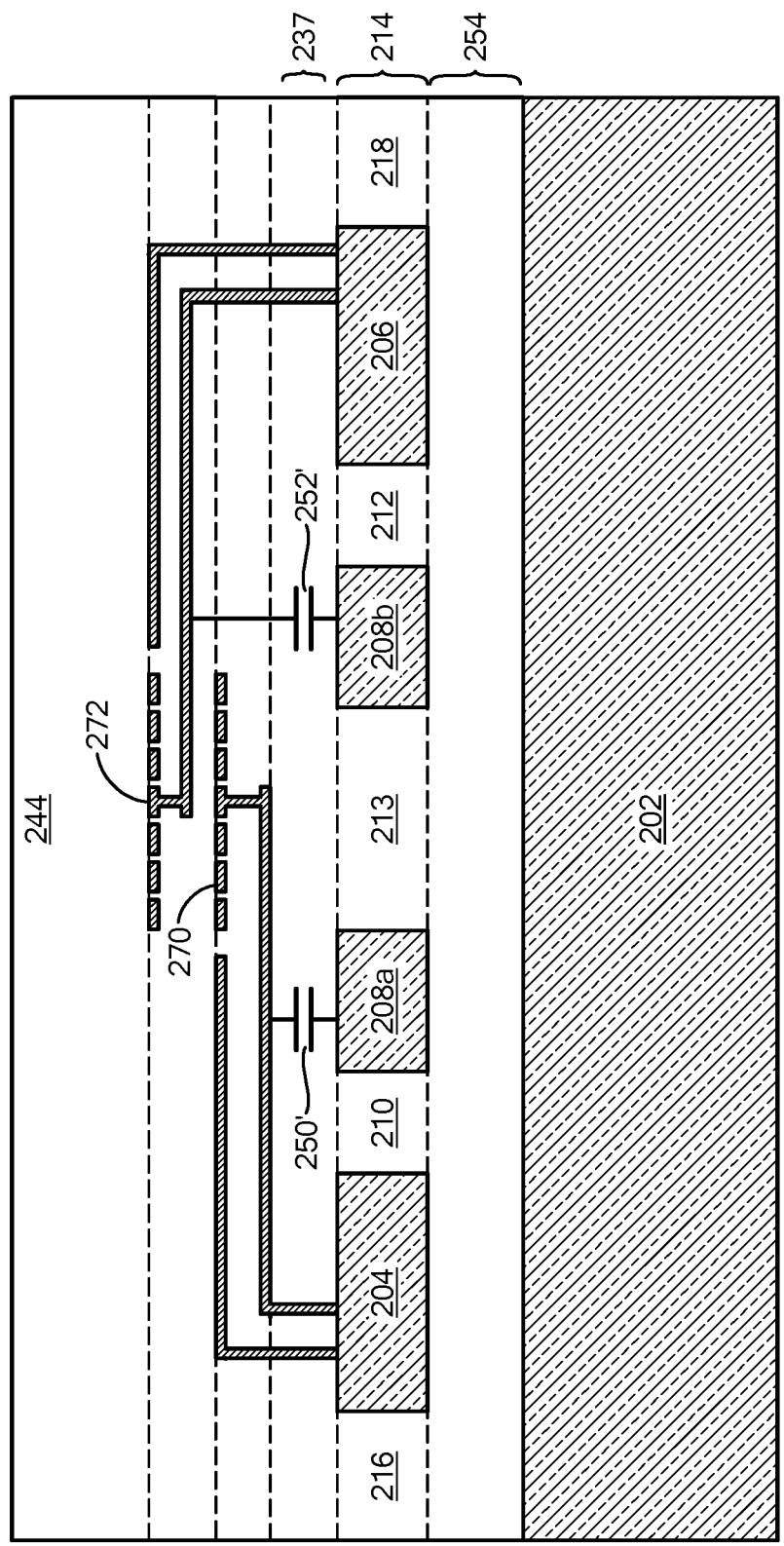
FIG. 2F is a cross-sectional representation of a signal isolator including inductive signal coupling and having multiple isolation islands in accordance with example embodiments of the invention.

FIG. 2F shows an example signal isolator having similarity with the isolator 200" of FIG. 2D having multiple isolation islands 208a,b separated by a trench 213. Multiple isolation islands 208a,b are described more fully below.

It is understood that while example embodiments are shown having circuit components for signal transfer including capacitors for capacitive coupling and coils for inductive coupling, it is understood that an isolation island between die regions can reduce parasitic capacitance effects in other isolator configurations using other signal transfer means.

Figure 3A:
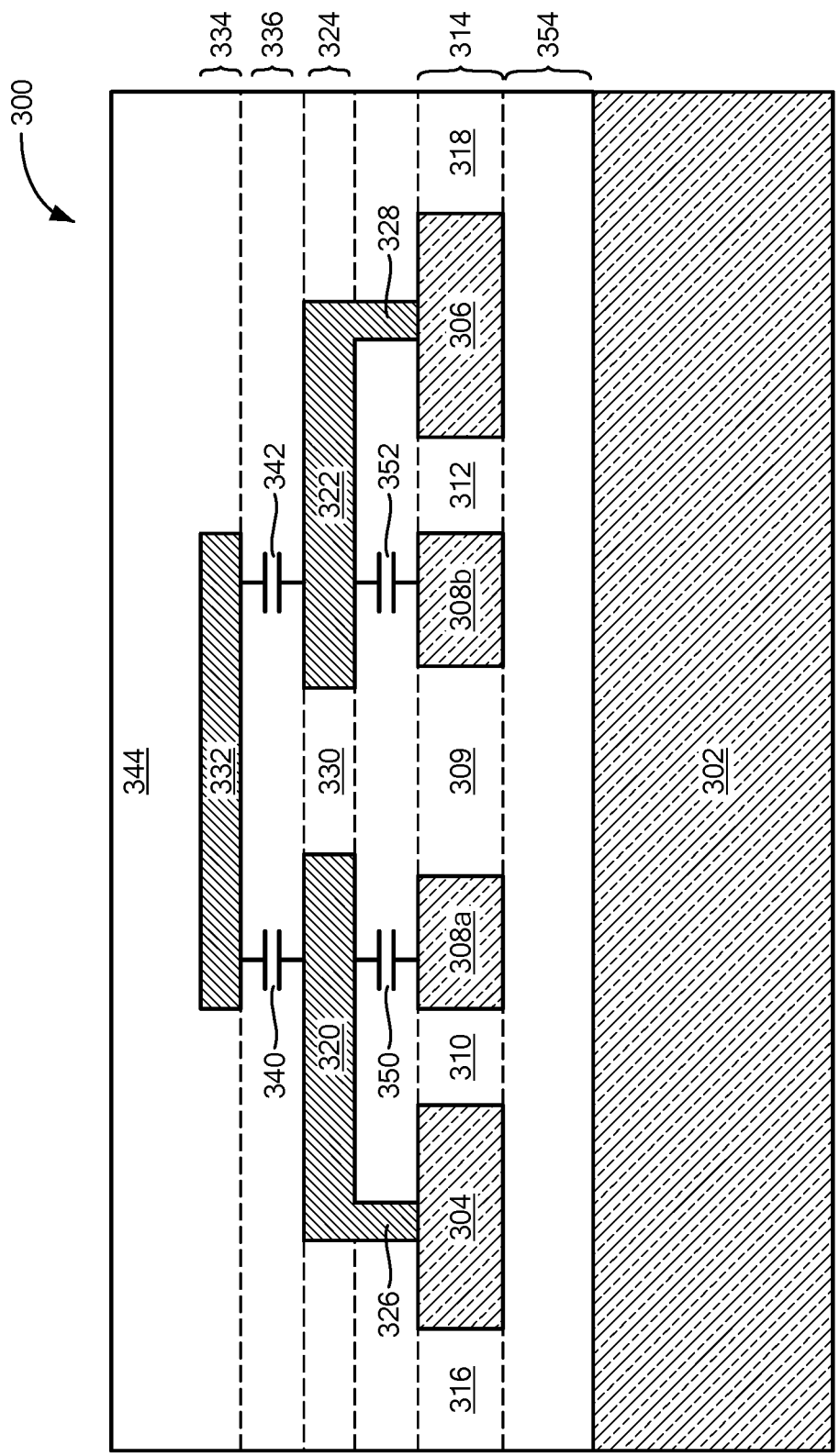
FIG. 3A is a cross-sectional view of a signal isolator having multiple isolation islands in accordance with example embodiments of the invention.
Figure 3B:
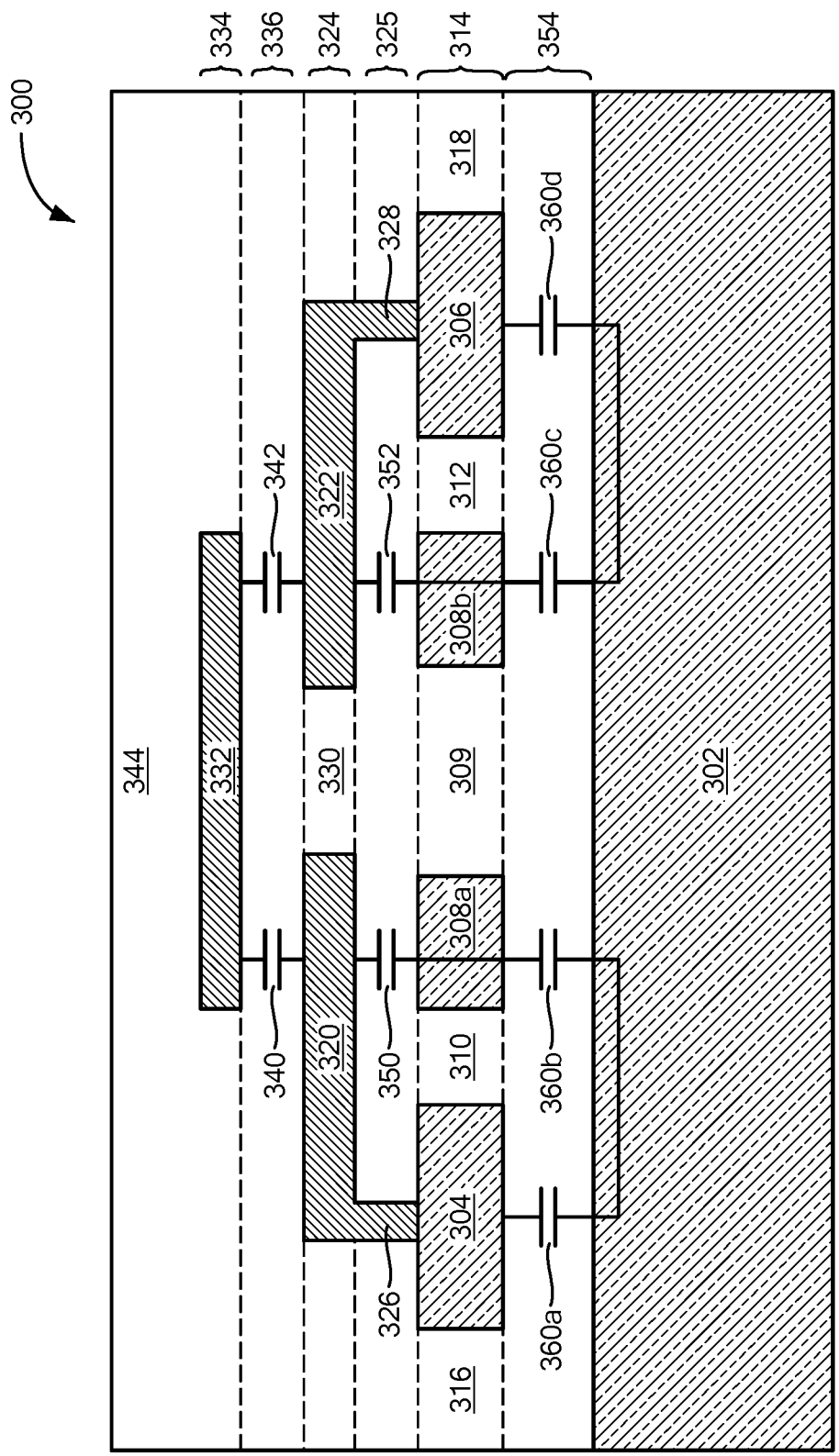
FIG. 3B shows certain electrical characteristics of the signal isolator of FIG. 3A.
Figure 3C:
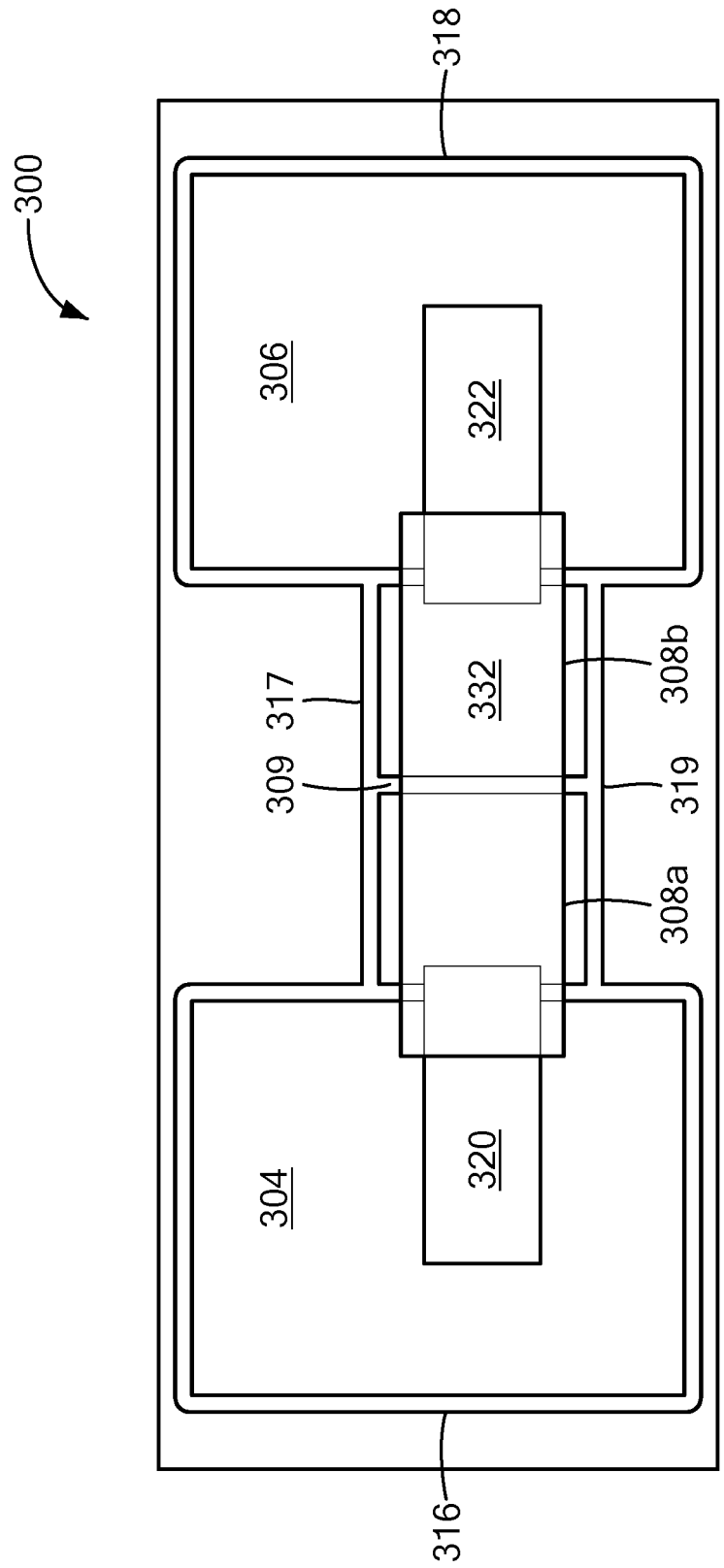
FIG. 3C is a view of the signal isolator of FIG. 3A from the top.

FIGS. 3A to 3C show a further embodiment of a signal isolator 300 having low parasitic characteristics provided by multiple epitaxial islands with some commonality with the isolator 200 of FIGS. 2A and 2B.

A substrate 302 has a first die portion 304 and a second die portion 306 separated by first and second isolation islands 308a,b, which are separated by an isolation trench 309, located in an epitaxial layer 314. In example embodiments, the first and second die portions 304, 306 comprise epitaxial regions and the isolation islands 308a,b comprise isolated epitaxial islands, which are separated from the first and second die portions 304, 306 by respective isolating trenches 310, 312. In embodiments, the isolation islands 308 can be considered die portions of a single die. There is substantially zero current flow between the isolation islands 308a,b so as to provide electrically isolated voltage domains. Further trenches 316, 318 can be located on the outer ends of the first and second die portions 302, 304. As seen in FIG. 3C, further trenches 317, 319 can be formed in the 'front' and 'back' of the epitaxial island 308.

A first metal region 320 and a second metal region 322 can be formed within a first metal layer 324. A first via 326 couples the first metal region 320 to the first die portion 304 and a second via 328 coupled the second metal region 322 to the second die portion 306. Within the first metal layer 324, dielectric material 330 can isolate the first and second metal regions 320, 322. A third metal region 332 can be formed in a second metal layer 334. In embodiments, the third metal region 332 is separated from the first and second metal regions 320, 322 by a dielectric layer 336, such as SiO2.

A first capacitor 340 is formed by the first metal region 320 and the third metal region 332 and a second capacitor 342 is formed by the second metal region 322 and the third metal region 332. It is understood that the capacitor symbols 340, 342 represent the capacitance provided by the respective first and second metal regions 320, 322 and the third metal region 332. As best seen in FIG. 3C, the third metal region 332 overlaps a portion of the first metal region 320 and a portion of the second metal region 322 to form the respective capacitors 340, 342. A passivation layer 344 can be provided over the third metal region 332 and dielectric layer 336, e.g., SiO2. The epitaxial layer 314 can be isolated from the substrate 302 by a buried oxide layer 354, for example.

In the illustrated embodiment, first and second parasitic capacitances 350, 352 are formed between the respective first metal region 320 and isolation island 308a and the second metal region 322 and island 308b.

FIG. 3B shows certain electrical characteristics of the isolator configuration of FIG. 3A including a series of parasitic capacitances 360a-d with the substrate 302. In the illustrated embodiment, the first die region 304 has a parasitic capacitance 360a, isolation island 308a has a parasitic capacitance 360b, isolation island 308b has a parasitic capacitance 360c, and the second die region 306 has a parasitic capacitance 360d.

In the illustrated embodiment, for the parasitic capacitances to reduce the desired data signal between the first and second die portions 304, 306, the parasitic path must go from the mid-level metal layer 324, through the oxide layer 325 above the isolation island 308a and the oxide layer 354 below the isolation island 308a, and then through the buried oxide layer 354 again up to the first die region 304. A similar parasitic path may exist for the second die region 306. Thus, with this arrangement, the effects of parasitic capacitances are reduced by having first and second isolation islands 308a,b that are isolated from each other.

In embodiments, a signal isolator may have isolated differential signal paths from a first die portion to a second die portion. The advantages of differential signal paths for a signal isolation IC package will be readily apparent to one skilled in the art.

Figure 3D:
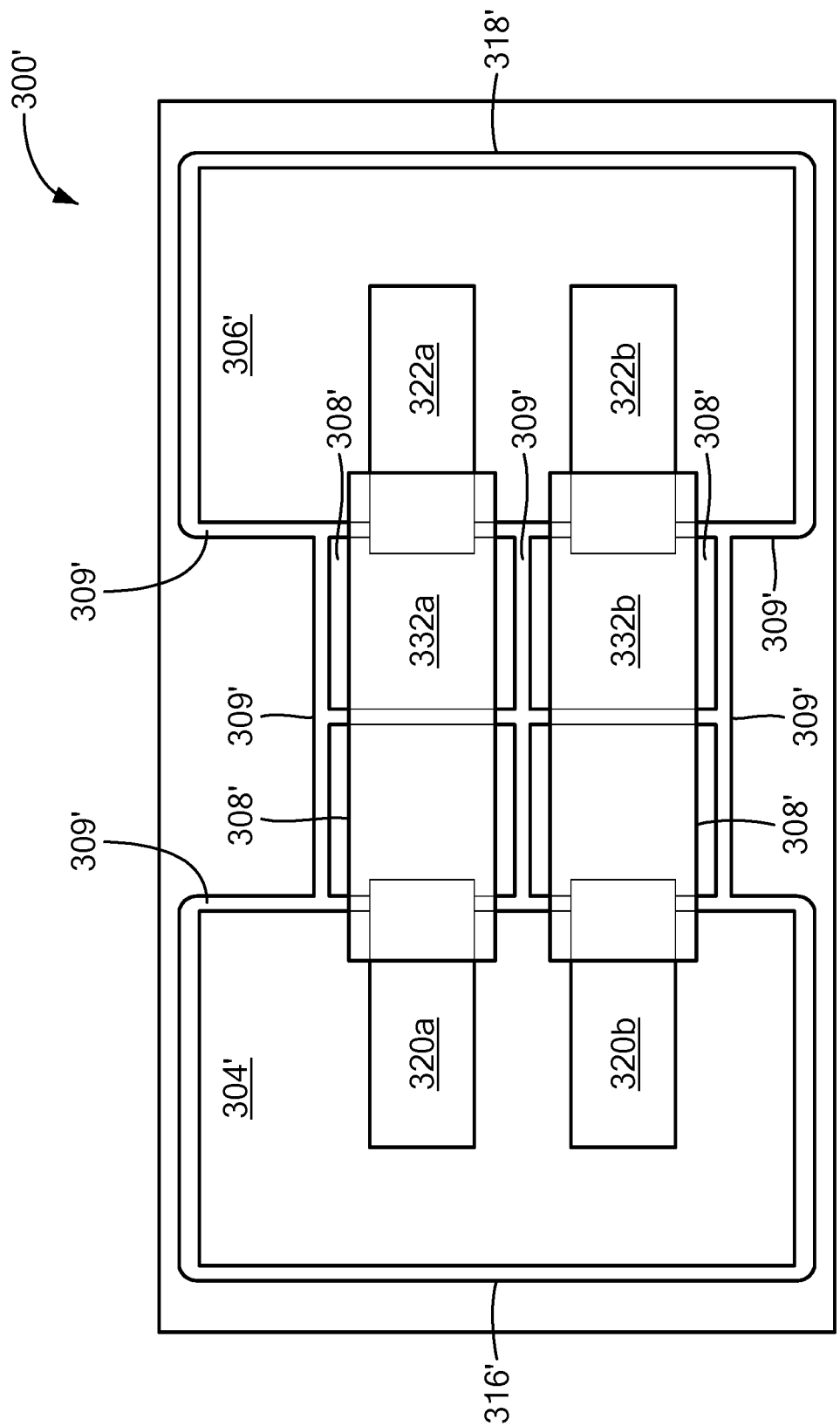
FIG. 3D is a view of a signal isolator of FIG. 3A from the top and having a differential isolated signal path.

FIG. 3D shows a differential implementation 300' of the signal isolators of FIGS. 3A and 3C. A first die portion 304' and a second die portion 306' are separated by isolation islands 308', which are separated by isolation trenches 309'. In embodiments, the isolation islands 308 can be considered die portions of a single die.

In the illustrated embodiment, a differential signal pair can be formed by parallel, isolated capacitively-coupled signal paths. A first signal in the differential signal pair is provided by first metal region 320a, second metal region 322a, and third metal region 332a. The second signal in the differential signal pair is provided by fourth metal region 320b, fifth metal region 322b, and sixth metal region 332b. As described above, the metal regions 320a, 322a, 332a and 320b, 320b, 332b form respective capacitors for a capacitively coupled isolated signal path.

Figure 4:
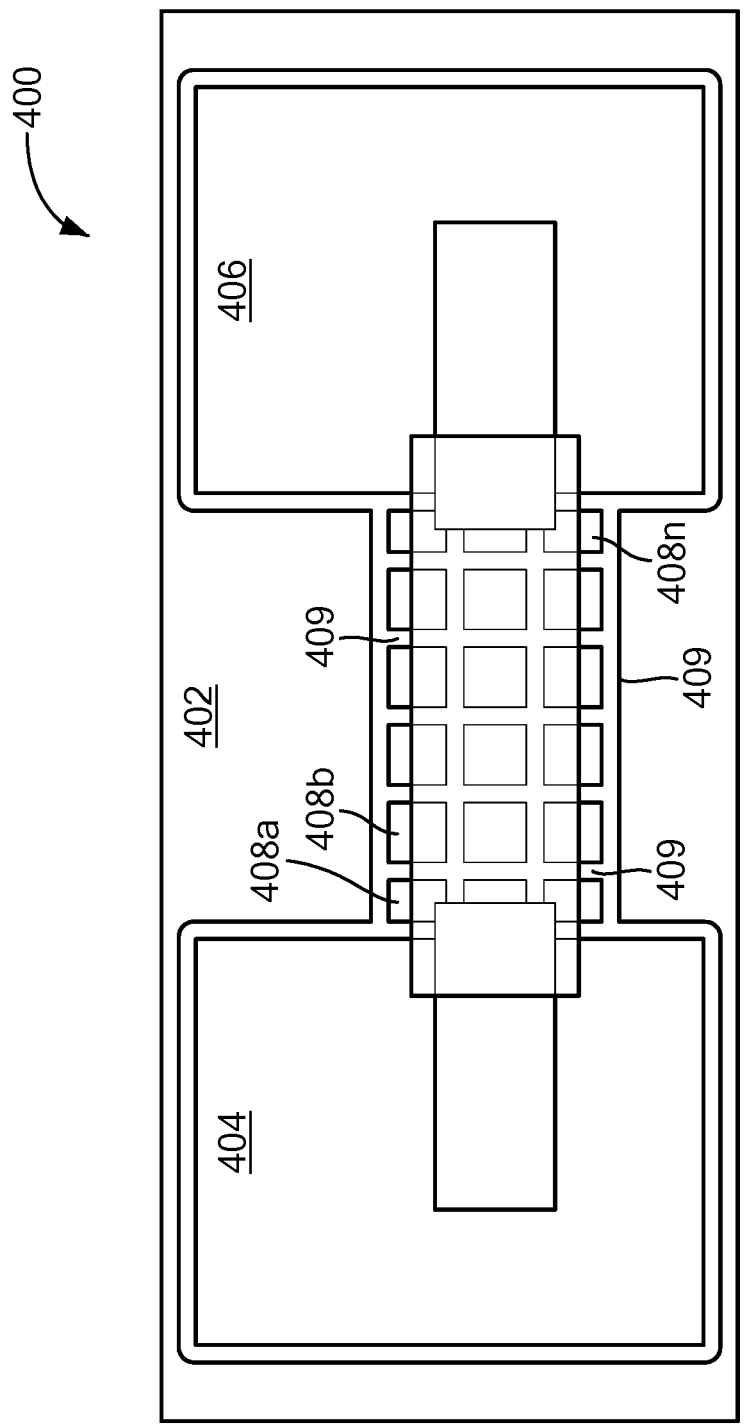
FIG. 4 is a top view of a signal isolator having a plurality of isolation islands in accordance with example embodiments of the invention.

It is understood that any practical number of isolation islands can be formed to meet the needs of a particular application. For example, FIG. 4 shows an isolator 400 including a silicon substrate 402 having a first die portion 404 and a second die portion 406 separated by isolation islands 408a-n, which are separated by isolation trenches 409, located in an epitaxial layer. In example embodiments, the first and second die portions 404, 406 are formed in the epitaxial layer and the isolation islands 408a,n comprise isolated epitaxial islands, which are separated from the first and second die portions 404, 406 by respective isolating trenches. There is substantially zero current flow between the isolation islands 408a-n. The multiple isolated islands have the benefit of further reducing the effects of parasitic capacitances by reducing the area of the conductive island and by splitting the total island into multiple, series-connected capacitors at each isolation trench 409 between the two die portions 404 and 406.

As described above, providing parallel signal paths between first and second die regions with an isolation island enhances the data signal between the die. Providing multiple isolation islands also enhances the data signal between the die but in a different way. The multiple isolation islands reduces the secondary signal path and reduces the parasitic capacitance from the main signal capacitors to it and to ground). One skilled in the art will appreciate that processing techniques may impose certain limitations, such as on the width of a trench and/or maintaining an area of constant voltage potential under a signal path, which provides a type of DC shield for preventing other circuitry from being disturbed by the data signal or by the high voltage transients that can occur.

It is understood that any suitable wafer material and processing techniques can be used in alternative embodiments.

It is understood that die portions can have any combination of drivers and receivers and each driver and receiver data transmission channel can share signal processing, routing, and diagnostic features or have such features for each individual data channel. In embodiments, outputs can be in buffered with a push-pull, open drain or other such output driver, or the output can be a magneto-resistive device with change in resistance indicating logic states.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A signal isolator, comprising:
a first die portion;
first metal region electrically connected to the first die portion;
a second die portion isolated from the first die portion;
a second metal region electrically connected to the second die portion;
a third metal region electrically isolated from the first and second metal regions;
a third die portion electrically isolated from the first, second and third metal regions,
wherein the first metal region, the second metal region, and the third metal region provide a first isolated signal path from the first die portion to the second die portion; and
wherein the first metal region, the second metal region and the third die portion provide a second isolated signal path from the first die portion to the second die portion in parallel with the first isolated signal path.

2. The signal isolator according to claim 1, wherein the first die portion, the second die portion and the third die portion are formed in a first layer, wherein the third die portion is electrically isolated from the first and second die portions.

3. The signal isolator according to claim 2, wherein the first layer comprises an epitaxial layer.

4. The signal isolator according to claim 1, wherein the third die portion is separated from the first die portion and the second die portion by respective isolating trenches.

5. The signal isolator according to claim 1, further including a layer of conductive material deposited on a top of the third die portion.

6. The signal isolator according to claim 1, wherein the first and second metal regions are formed in a first metal layer.

7. The signal isolator according to claim 6, wherein a third metal region is formed in a second metal layer.

8. The signal isolator according to claim 1, wherein the first isolated signal path comprises a first capacitor capacitively coupled with a second capacitor, wherein the first capacitor comprises the first metal region and the third metal region, and the second capacitor comprises the third metal region and the second metal region.

9. The signal isolator according to claim 8, wherein the second isolated signal path includes a third capacitor capacitively coupled to a fourth capacitor, wherein the third capacitor comprises the first metal region and the third die portion, and the fourth capacitor comprises the third die portion and the second metal region.

10. The signal isolator according to claim 1, wherein the third metal region overlaps with the first and second metal regions.

11. The signal isolator according to claim 1, wherein the first isolated signal path comprises a differential signal pair.

12. A signal isolator, comprising:
a first die portion;
a first metal region electrically connected to the first die portion;
a second die portion isolated from the first die portion;
a second metal region electrically connected to the second die portion;
a third metal region electrically isolated from the first and second metal regions;
a third die portion electrically isolated from the first, second and third metal regions; and
a fourth die portion electrically isolated from the first, second and third metal regions and isolated from the third die portion,
wherein the first metal region, the second metal region, and the third metal region provide an isolated signal path from the first die portion to the second die portion,
wherein the first die portion, the second die portion, the third die portion, and the fourth die portion are formed in a first layer, wherein the third die portion is electrically isolated from the fourth die portion, and
wherein the first layer comprises an epitaxial layer.

13. The signal isolator according to claim 12, wherein the third die portion is separated from the fourth die portion by respective isolating trenches.

14. The signal isolator according to claim 12, wherein the first and second metal regions are formed in a first metal layer.

15. The signal isolator according to claim 14, wherein a third metal region is formed in a second metal layer.

16. The signal isolator according to claim 12, wherein the isolated signal path comprises a first capacitor capacitively coupled with a second capacitor, wherein the first capacitor comprises the first metal region and the third metal region, and the second capacitor comprises the third metal region and the second metal region.

17. The signal isolator according to claim 12, wherein the third metal region overlaps with the first and second metal regions.

18. The signal isolator according to claim 12, wherein the isolated signal path comprises a differential signal pair.

19. A signal isolator, comprising:
a first die portion;
first metal region electrically connected to the first die portion;
a second die portion isolated from the first die portion;
a second metal region electrically connected to the second die portion;
a third metal region electrically isolated from the first and second metal regions;
a third die portion electrically isolated from the first, second and third metal regions,
wherein the first metal region, the second metal region, and the third metal region provide a first isolated signal path from the first die portion to the second die portion, wherein the first isolated signal path does not include the third die portion; and
wherein the first metal region, the second metal region and the third die portion provide a second isolated signal path from the first die portion to the second die portion in parallel with the first isolated signal path.

20. A signal isolator, comprising:
a first die portion;
first metal region electrically connected to the first die portion;
a second die portion isolated from the first die portion;
a second metal region electrically connected to the second die portion;
a third metal region electrically isolated from the first and second metal regions;
a third die portion electrically isolated from the first, second and third metal regions, wherein the first metal region, the second metal region, and the third metal region provide a first isolated signal path from the first die portion to the second die portion; and wherein the first metal region, the second metal region and the third die portion provide a second isolated signal path from the first die portion to the second die portion in parallel with the first isolated signal path, wherein the first, second, and third metal regions are on the same side of the third die portion.

\* \* \* \* \*